US012796362B2

(12) United States Patent
Ueha et al.

(10) Patent No.: US 12,796,362 B2
(45) Date of Patent: Nov. 10, 2026

(54) METHOD OF USING A TEMPLATE TO FORM A CURED PATTERN ON AN IMPRINT MATERIAL WHERE THE TEMPLATE HAS A MATHEMATICALLY DEFINED SPACING BETWEEN FIRST AND SECOND RECESSED PORTIONS THEREIN AND THE DEPTHS OF SUCH RECESSED PORTIONS AND THE CURED IMPRINT MATERIAL HAS A MATHEMATICALLY DEFINED SPACING BETWEEN FIRST AND SECOND PROTRUDING PORTIONS AND THE HEIGHTS OF SUCH PROTRUDING PORTIONS

(71) Applicant: Kioxia Corporation, Tokyo (JP)

(72) Inventors: Koki Ueha, Yokkaichi Mie (JP); Katsuyoshi Kodera, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 450 days.

(21) Appl. No.: 18/458,056

(22) Filed: Aug. 29, 2023

(65) Prior Publication Data

US 2024/0096644 A1 Mar. 21, 2024

(30) Foreign Application Priority Data

Sep. 20, 2022 (JP) ................................ 2022-149462

(51) Int. Cl.
*G03F 7/00* (2006.01)
*H10P 50/00* (2026.01)
(Continued)

(52) U.S. Cl.
CPC ............ *H10P 50/71* (2026.01); *G03F 7/0002* (2013.01); *H10W 20/063* (2026.01); *H10P 50/266* (2026.01)

(58) Field of Classification Search
CPC .... H10P 50/71; H10P 50/266; H10P 76/2041; G03F 7/0002; H10W 20/063
See application file for complete search history.

(56) References Cited

U.S. PATENT DOCUMENTS

2011/0070733 A1* 3/2011 Kikuchi ................ G03F 7/0002 257/E21.294
2018/0310413 A1* 10/2018 Kasai .................. H05K 3/0014
(Continued)

FOREIGN PATENT DOCUMENTS

JP 5499668 B2 5/2014
JP 6136721 B2 5/2017
(Continued)

OTHER PUBLICATIONS

Y. Yamazaki, "Peeling off the tape and thinking: Towards 'the physics of adhesion'", Journal of the Physical Society of Japan, vol. 71, No. 5, 2016, pp. 318-322, URL: https://www.jps.or.jp/books/gakkaishi/2016/05/71-05mijika.pdf.

*Primary Examiner* — William B Partridge
*Assistant Examiner* — Erik A. Anderson
(74) *Attorney, Agent, or Firm* — Kim & Stewart LLP

(57) ABSTRACT

According to one embodiment, a pattern forming method uses a template having a first region with a first recessed portion and a second region adjacent to the first region. The second region has a second recessed portion therein. The recessed portions satisfy a specific relationship ($D_1>2(H_1+H_2)/\pi$), where $D_1$ is a shortest distance between the first and second recessed portions, $H_1$ is a depth of the first recessed portion, and $H_2$ is a depth of the second recessed portion. The pattern forming method includes placing an imprint material on an object and pressing the template against the material to mold the imprint material. The molded imprint material is then cured, and the template removed.

10 Claims, 11 Drawing Sheets

(51) Int. Cl.
*H10W 20/00* (2026.01)
*H10P 50/26* (2026.01)

(56) References Cited

U.S. PATENT DOCUMENTS

| | | | | |
|---|---|---|---|---|
| 2019/0080899 | A1* | 3/2019 | Mitsugi | H10P 76/00 |
| 2021/0149297 | A1* | 5/2021 | Hayashi | G03F 7/0002 |

FOREIGN PATENT DOCUMENTS

| | | | |
|---|---|---|---|
| JP | 6156013 | B2 | 7/2017 |
| JP | 6171453 | B2 | 8/2017 |

* cited by examiner

CROSS-SECTIONAL VIEW TAKEN ALONG A1-A2

METHOD OF USING A TEMPLATE TO FORM A CURED PATTERN ON AN IMPRINT MATERIAL WHERE THE TEMPLATE HAS A MATHEMATICALLY DEFINED SPACING BETWEEN FIRST AND SECOND RECESSED PORTIONS THEREIN AND THE DEPTHS OF SUCH RECESSED PORTIONS AND THE CURED IMPRINT MATERIAL HAS A MATHEMATICALLY DEFINED SPACING BETWEEN FIRST AND SECOND PROTRUDING PORTIONS AND THE HEIGHTS OF SUCH PROTRUDING PORTIONS

CROSS-REFERENCE TO RELATED APPLICATION

This application is based upon and claims the benefit of priority from Japanese Patent Application No. 2022-149462, filed Sep. 20, 2022, the entire contents of which are incorporated herein by reference.

FIELD

Embodiments described herein relate generally to a pattern forming method, a manufacturing method of a semiconductor device, and a semiconductor device.

BACKGROUND

A technique of forming a fine pattern using nanoimprint lithography (NIL) is known as a manufacturing method of a semiconductor device.

DETAILED DESCRIPTION

Figure 1:
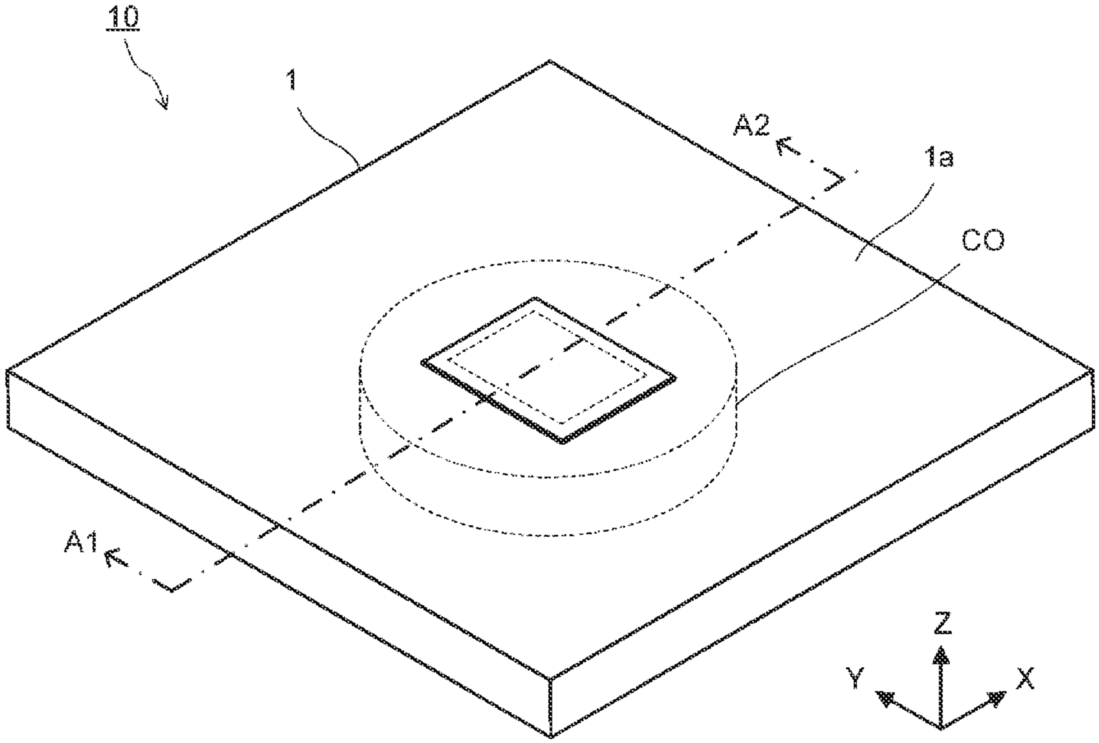
FIG. 1 is a schematic perspective view illustrating a template.

Embodiments describe a method of forming a desired pattern with high accuracy.

In general, according to one embodiment, a pattern forming method uses a template that has a first region with a first recessed portion and a second region adjacent to the first region. The second region has a second recessed portion therein. The recessed portions satisfy a specific relationship ($D_1>2(H_1+H_2)/\pi$), where $D_1$ is a shortest distance between the first and second recessed portions, $H_1$ is a depth of the first recessed portion, and $H_2$ is a depth of the second recessed portion. The pattern forming method includes placing an imprint material on an object and pressing the template against the material to mold the imprint material. The molded imprint material is then cured and the template removed.

Hereinafter, certain example embodiments will be described with reference to the drawings. The relationship between the thickness and plane dimension of each component shown in the drawings, the ratio of the thickness of each component, and the like may differ from the actual implementations of an embodiment. In the described embodiments, substantially the same components are denoted by the same reference numerals, and description thereof will be omitted as appropriate.

In a pattern forming method using NIL, a device pattern of an original plate (called a template) is pressed onto a layer of an imprint material such as an ultraviolet curable resin provided on an object (e.g., substrate, a semiconductor wafer, or the like), the layer is then irradiated with light such as ultraviolet light to cure the now-patterned layer, and the device pattern is thus transferred to the imprint material layer.

Figure 2:
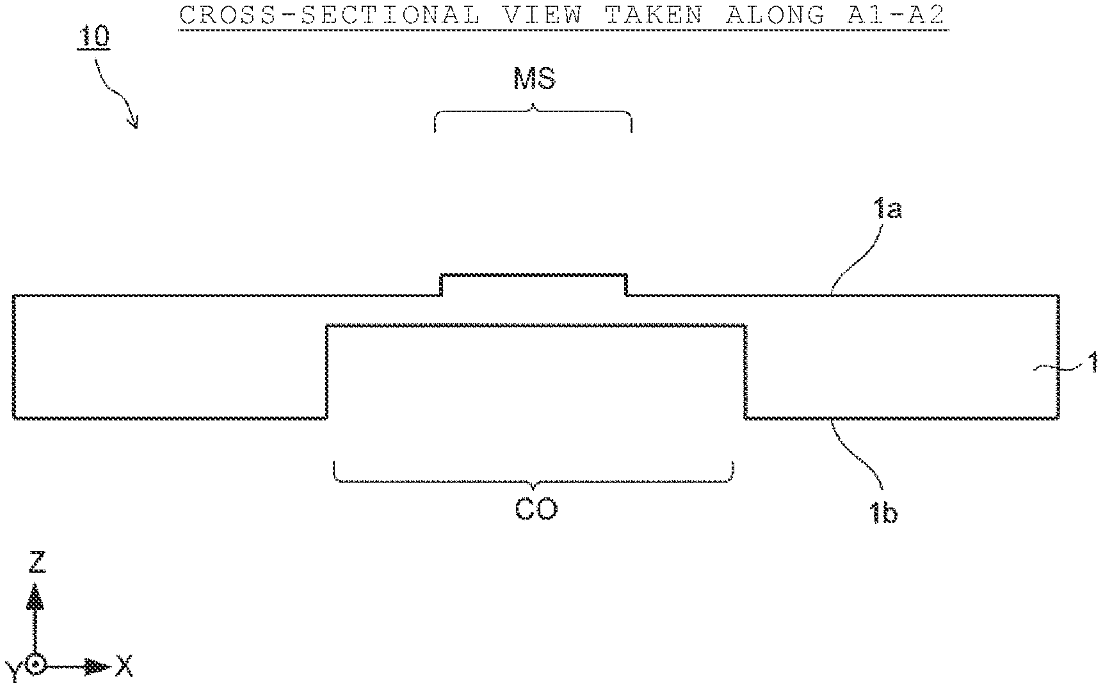
FIG. 2 is a schematic cross-sectional of a template.

FIG. 1 is a schematic perspective view illustrating a structural example of a template. FIG. 2 is a schematic cross-sectional view illustrating the structural example of the template. FIGS. 1 and 2 each show an X-axis, a Y-axis orthogonal to the X-axis, and a Z-axis orthogonal to each of the X-axis and the Y-axis. FIG. 2 shows the cross section taken along a line segment A1-A2 shown in FIG. 1.

A template 10 includes a substrate portion 1 having a surface 1*a* with a mesa MS, and a surface 1*b* with a recessed portion CO, as shown in FIGS. 1 and 2. The mesa MS is a portion where a device pattern is formed. The planar shape of the mesa MS is not particularly limited, but is rectangular in this example. The surface 1*a* can be referred to as the main surface.

Examples of the substrate 1 may be quartz, for example. The substrate 1 preferably transmits the light.

Figure 3:
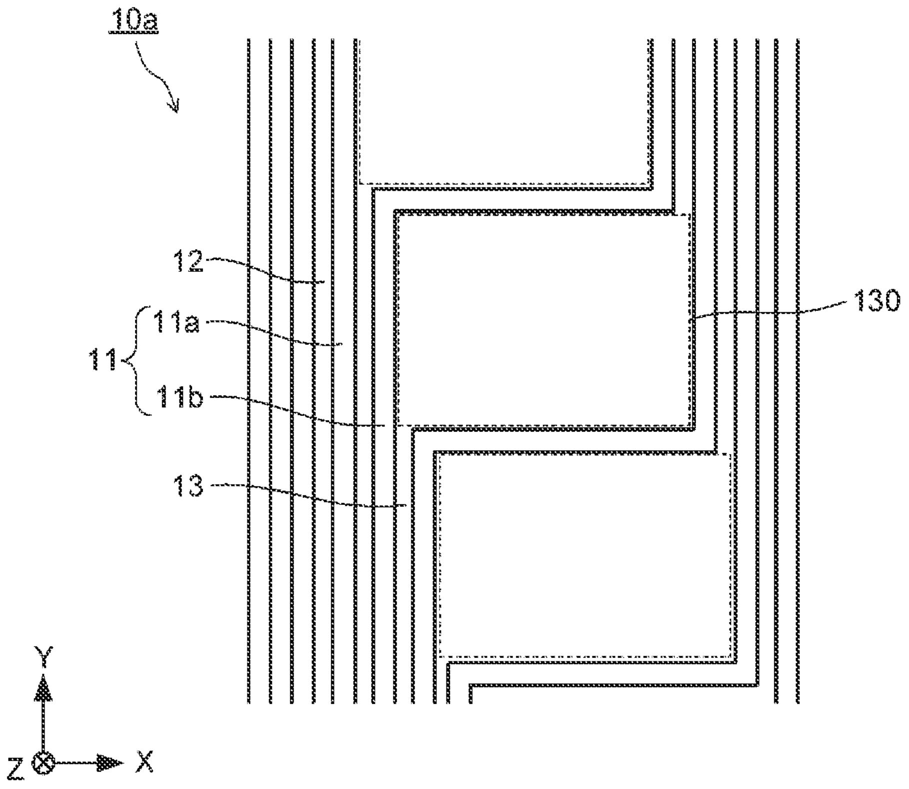
FIG. 3 is a schematic top view showing a layout example of a device pattern formed on a mesa of a template.
Figure 4:
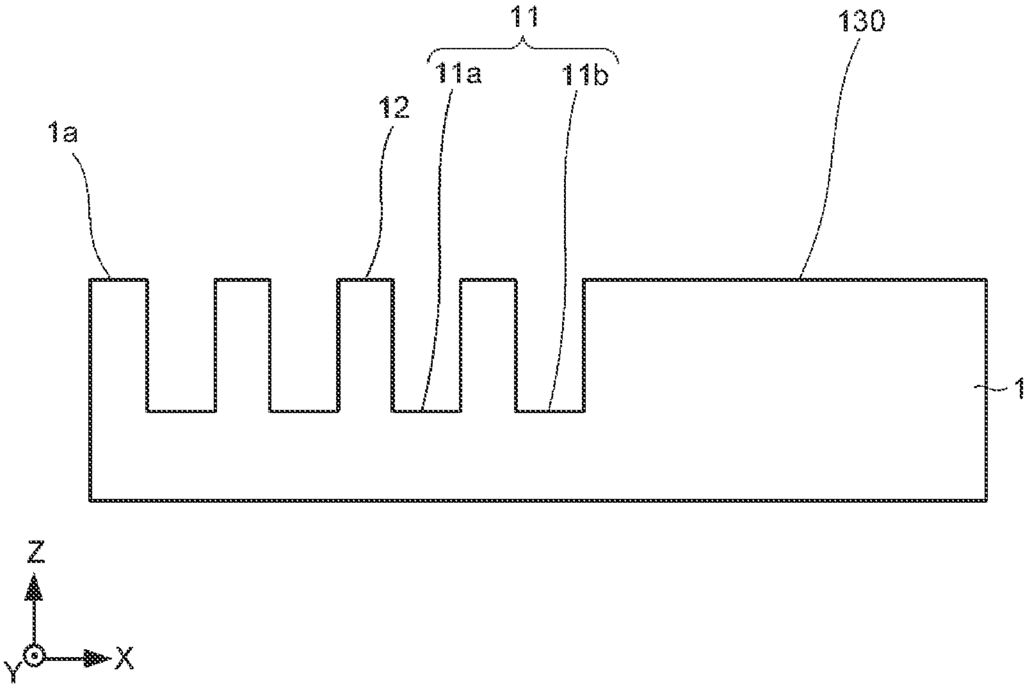
FIG. 4 is a schematic cross-sectional view of the layout example of the device pattern.

FIG. 3 is a schematic top view showing a layout example of a device pattern that can be formed on the mesa MS. FIG. 4 is a schematic cross-sectional view showing a layout example of the device pattern. FIG. 4 shows a portion of a cross section including the X-axis of the template 10 and the Z-axis of the template 10.

The device pattern 10*a* has recessed portions 11, protruding portions 12, and protruding portions 13. FIG. 3 shows a plurality of recessed portions 11, a plurality of protruding portions 12, and a plurality of protruding portions 13. Each of the plurality of recessed portions 11 and each of the plurality of protruding portions 12 extend, for example, along the Y-axis direction and are alternately disposed along the X-axis direction to form a line-and-space pattern.

The plurality of recessed portions 11 shown in FIG. 3 includes recessed portions 11*a* and recessed portions 11*b*. The recessed portion 11*a* extends along the Y-axis direction. The recessed portion 11*b* is the recessed portion 11 closest to the protruding portion 13. The recessed portion 11*b* extends between a pair of protruding portions 13, for example. In FIG. 3, the recessed portion 11*b* has a crank shape that bends and extends in the Y-axis direction, the X-axis direction, and the Y-axis direction again. The shape of the recessed portion 11*b* is not limited to the shape shown in FIG. 3. Furthermore, the recessed portion 11*b* may not necessarily be provided in all examples.

The protruding portion 13 is provided between recessed portions 11. The protruding portion 13 has a region 130 provided on the surface 1*a* adjacent to the line-and-space pattern region. The dimension of the region 130 in at least one of the X-axis direction and the Y-axis direction is greater than the width of the protruding portion 12 in the X-axis direction in FIG. 3. The dimension of the region 130 in the X-axis direction shown in FIG. 3 is greater than the width of the protruding portion 12 in the X-axis direction. The dimension of the region 130 in the Y-axis shown in FIG. 3 is also greater than the width of the protruding portion 12 in the X-axis direction.

Figure 5:
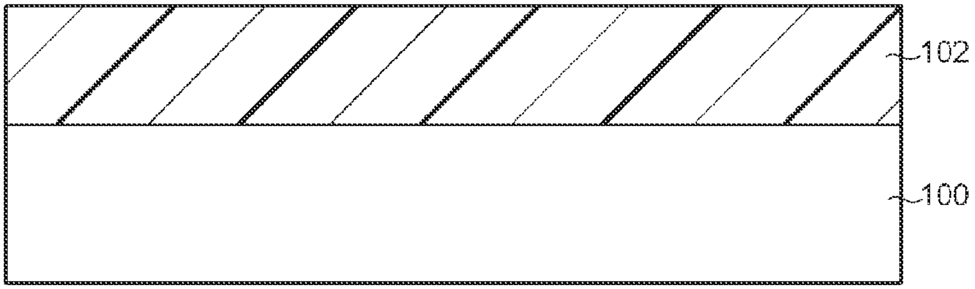
FIG. 5 is a schematic cross-sectional view illustrating aspects of a pattern forming method.
Figure 6:
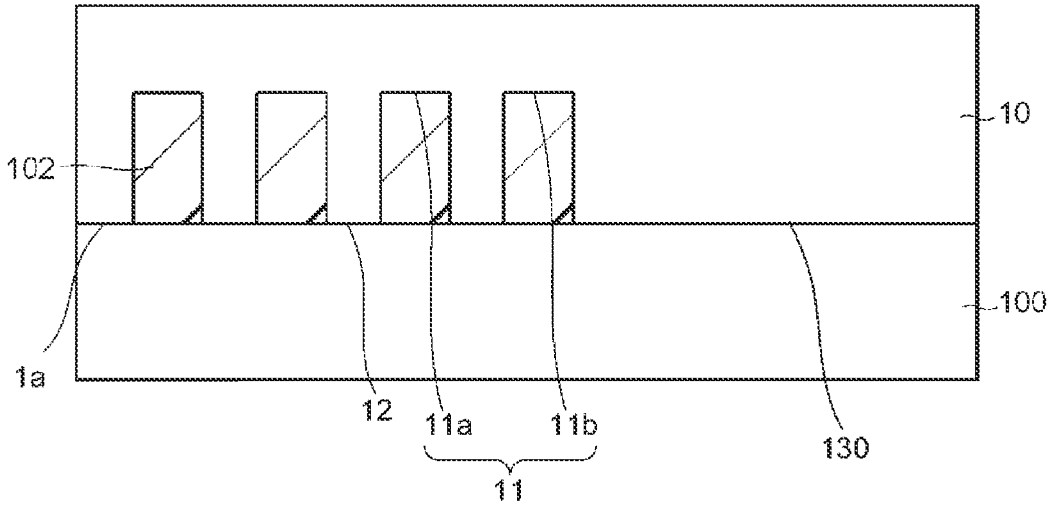
FIG. 6 is a schematic cross-sectional view illustrating aspects of a pattern forming method.
Figure 7:
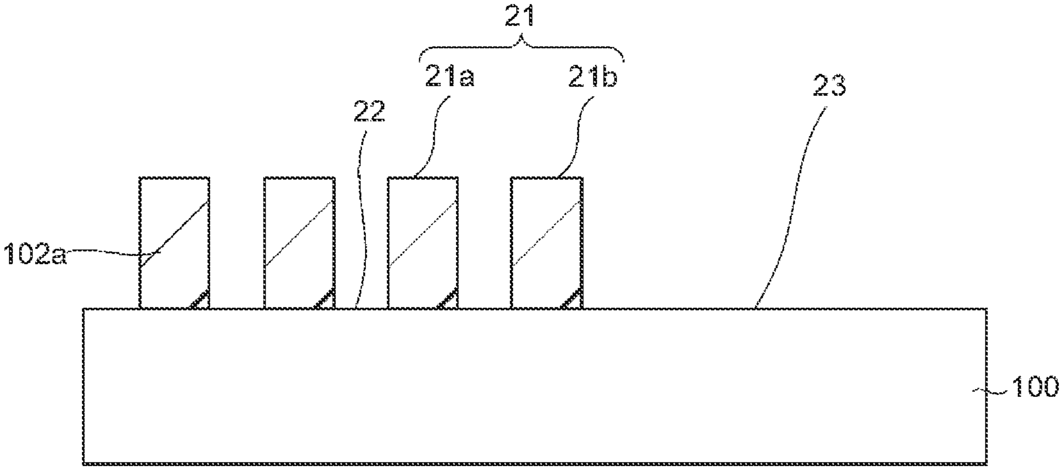
FIG. 7 is a schematic cross-sectional view illustrating aspects of a pattern forming method.

Next, a pattern forming method using the template 10 will be described. FIGS. 5, 6, and 7 are schematic cross-sectional views illustrating aspects of the pattern forming method.

In this pattern forming method, first, as shown in FIG. 5, a resist layer 102 is formed on an object 100. The object 100 is, for example, a stacked body formed by stacking at least one film on a semiconductor substrate. The configuration of the object 100 is not particularly limited. The resist layer 102 is an imprint material such as an ultraviolet curable resin, which depending on different possible embodiments may be resist material for subsequent processing of the object 100 or conductive permanent film that may remain on the object 100. The resist layer 102 can be formed by applying an imprint material to the surface of the object 100 using an inkjet method or a coating method, for example.

Next, the surface 1*a* of the template 10 is disposed downward above the resist layer 102, as shown in FIG. 6, the template 10 is pressed against the resist layer 102 to mold the resist layer 102, and the molded portion is cured by applying light while the template 10 is pressed against the molded resist layer 102. Although specific illustration is omitted in FIG. 6, the template 10 when pressed against the resist layer 102 leaves a residual film of the resist layer 102 between template 10 and the object 100.

After that, the template 10 is separated from the object 100, as shown in FIG. 7. Thus, the cured layer 102*a* of the resist layer 102 having the protruding portions 21, the recessed portions 22, and the recessed portions 23 can be formed on the object 100. FIG. 7 shows a plurality of protruding portions 21. The plurality of protruding portions 21 includes protruding portions 21*a* and protruding portions 21*b*. The protruding portion 21*a* is formed in a portion facing the recessed portion 11*a* when the template 10 is pressed. The protruding portion 21*b* is formed in a portion facing the recessed portion 11*b* when the template 10 is pressed. The recessed portion 22 is formed in a portion facing the protruding portion 12 when the template 10 is pressed. The recessed portion 23 is formed in a portion facing the region 130 of the protruding portion 13 when the template 10 is pressed.

When the pitch (width) of the protruding portions 21 is narrow and the protruding portions 21 have a high aspect ratio, the stress generated when the template 10 is separated from the object 100 may act to deform the protruding portions 21. In particular, the protruding portion 21*b* located at the end (edge) of the line-and-space pattern and adjacent to the recessed portion 23 is likely to be deformed by the stress. For example, if the object 100 is processed after the protruding portion 21*b* falls down and comes into contact with the protruding portion 21*a* without returning to its original state, it becomes difficult to form a desired pattern.

Accordingly, in the pattern forming method of an embodiment, a dummy pattern is formed using the template 10 having recessed portions near the ends of the line-and-space pattern.

First Embodiment

Figure 8:
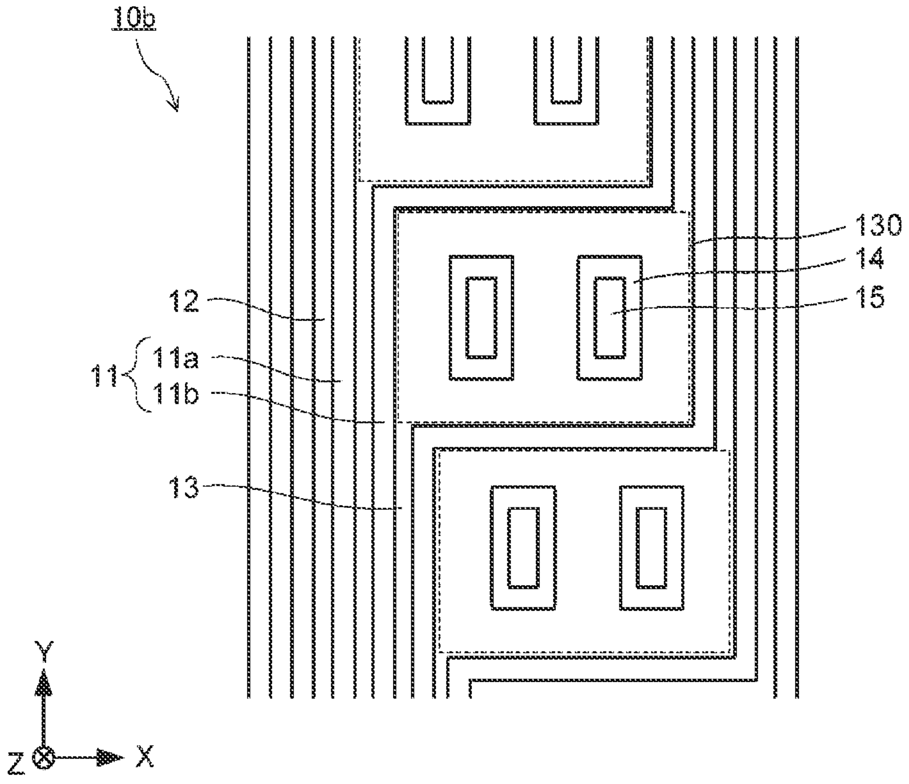
FIG. 8 is a schematic top view showing a layout example of a device pattern having a dummy pattern region for a first embodiment.
Figure 9:
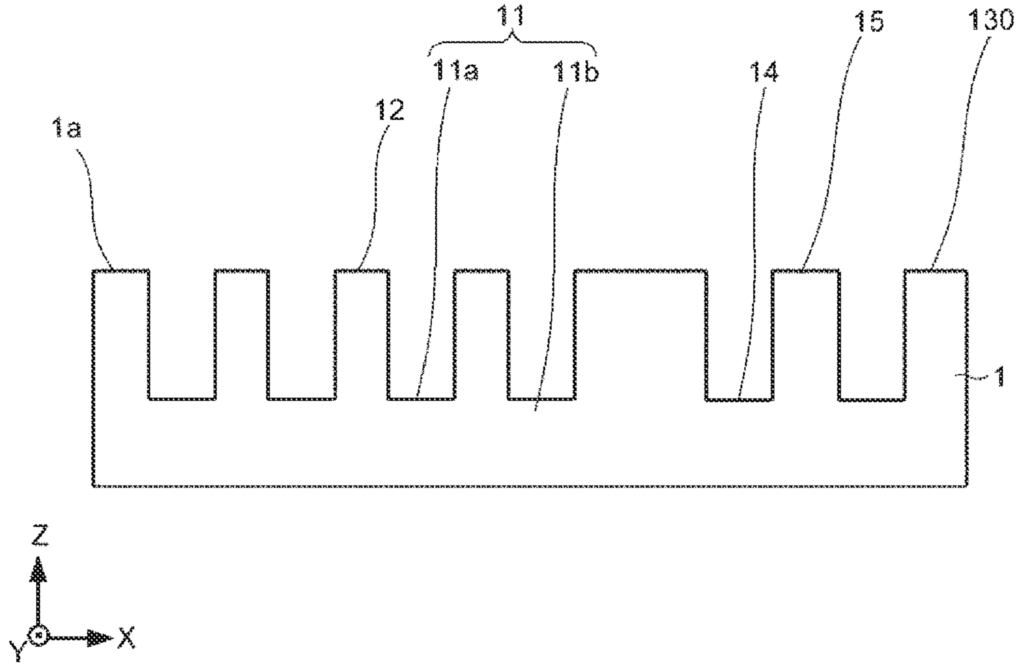
FIG. 9 is a schematic cross-sectional view showing the layout example of the device pattern including a dummy pattern in the first embodiment.

FIG. 8 is a schematic top view showing a layout example of a device pattern having a dummy pattern region in the template of a first embodiment. FIG. 9 is a schematic cross-sectional view of the device pattern including the dummy pattern in the first embodiment.

The device pattern 10*b* has a recessed portion 11, a protruding portion 12, a protruding portion 13, a recessed portion 14, and a protruding portion 15. The description of the device pattern 10*a* can be used as appropriate for the description of the recessed portions 11, the protruding portions 12, and the protruding portions 13. The recessed portion 11, the protruding portion 12, the protruding portion 13, the recessed portion 14, and the protruding portion 15 can be formed by partially processing the surface 1*a* of the template 10 by etching using a mask such as a metal mask.

The recessed portions 14 and the protruding portions 15 form the dummy patterns. The recessed portion 14 is provided in the region 130 of the protruding portion 13. The protruding portion 15 is surrounded by the recessed portion 14 in the region 130. FIG. 8 shows a plurality of recessed portions 14 and a plurality of protruding portions 15. The number of recessed portions 14 is not particularly limited. Although the recessed portion 14 shown in FIG. 8 is annular, the shape of the recessed portion 14 is not particularly limited. The protruding portion 15 has, for example, the same height as the protruding portion 12. It should be noted that that the protruding portion 15 need not necessarily be provided in all embodiments.

By forming a dummy pattern in the region 130, the deformation of the protruding portion 21 can be reduced.

The reason for this is thought to be due to, but is not limited to, the following mechanisms.

Figure 10:
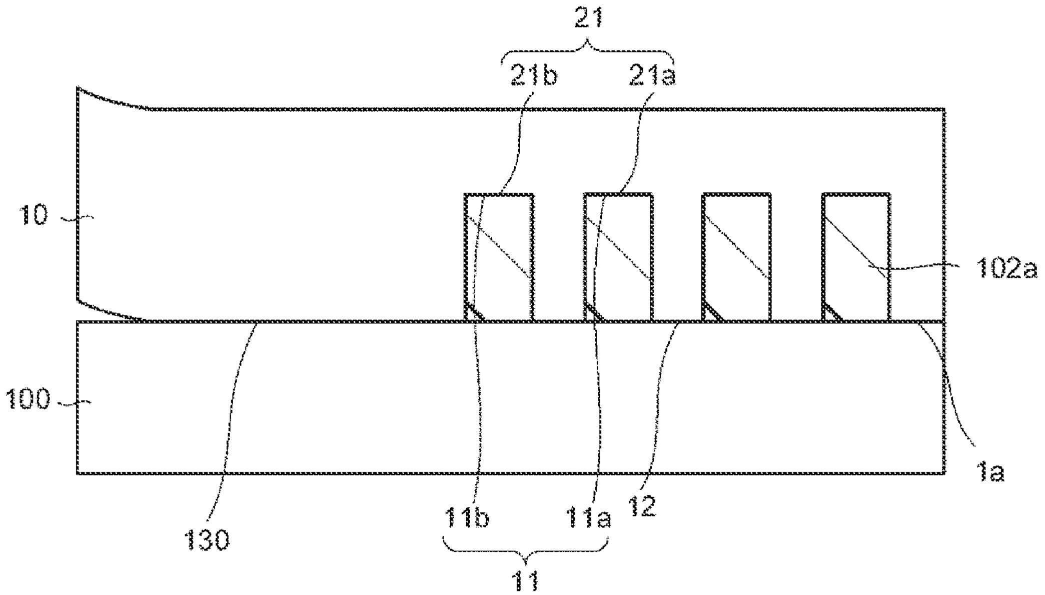
FIG. 10 is a schematic view illustrating aspects of an example of a deformation mechanism when the template is being separated for a device pattern that does not include a dummy pattern.
Figure 11:
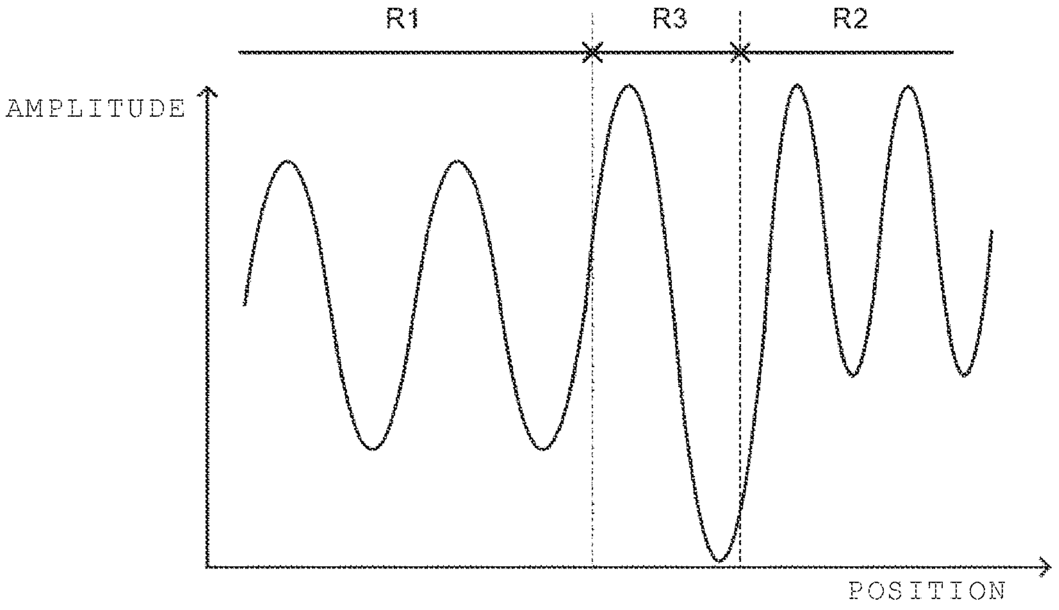
FIG. 11 is a schematic view illustrating aspects of an example of the deformation mechanism for the device pattern that does not include the dummy pattern.
Figure 12:
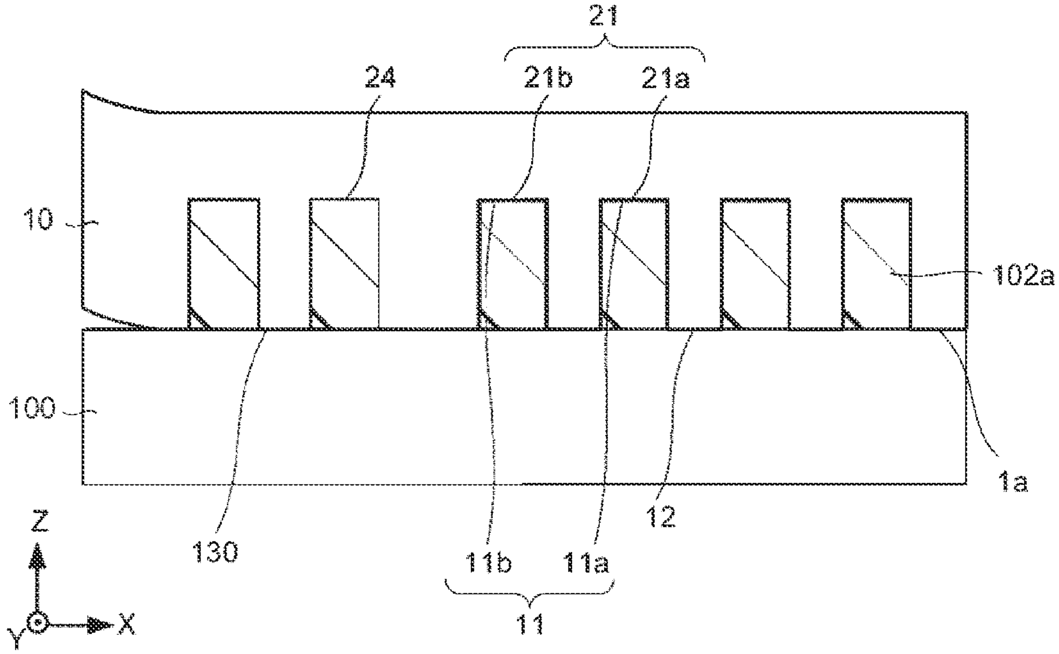
FIG. 12 is a schematic view illustrating an example of a deformation mechanism when the template is separated for a device pattern including a dummy pattern.
Figure 13:
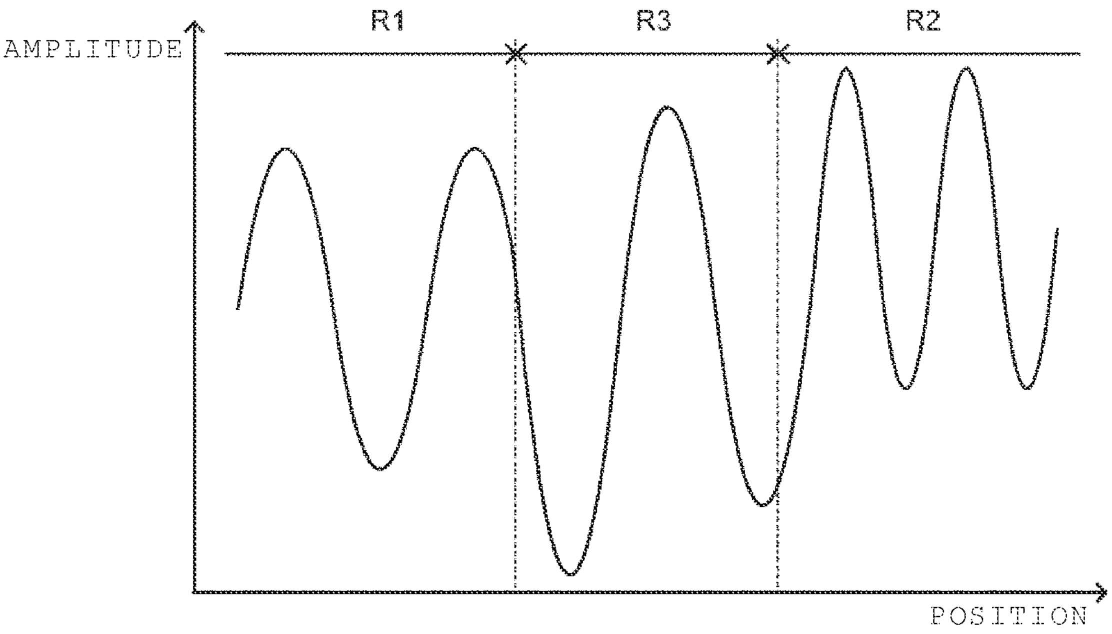
FIG. 13 is a schematic view illustrating aspects of an example of the deformation mechanism for the device pattern including the dummy pattern.

FIGS. 10 and 11 are schematic views illustrating an example of a deformation mechanism of the device pattern 10*a* that does not include a dummy pattern when the template 10 is separated from the resist layer 102. FIGS. 12 and 13 are schematic views illustrating an example of a deformation mechanism of the device pattern 10*b* including a dummy pattern when the template 10 is separated. Although FIGS. 10 and 12 show that the template 10 is bent and separated, the template 10 can, in some instances, actually be separated without being noticeably bent.

After molding the resist layer 102, as shown in FIG. 10, a "Stick-Slip" vibration occurs when the template 10 having no dummy pattern is separated from the object 100 from the region 130 side, for example. Stick-Slip vibration is a self-excited or induced vibration that occurs at the friction surface between the template 10 and the now cured resist layer 102 when the template 10 is being removed. As shown in FIG. 11, the amplitude of the Stick-Slip vibration changes greatly in a region R3 (also referred to as coverage ratio boundary) including the recessed portion 11*b* between a region R1 including the region 130 and a region R2 including the protruding portion 12 and the recessed portion 11*a*. The stress caused by this vibration causes the device pattern 10*a* to vibrate, and the protruding portion 21*b* located in the region R3 thus vibrates greatly and is likely to stick to the protruding portion 21*a* and/or fall down.

However, as shown in FIG. 12, when the template 10 having the dummy pattern is separated from the object 100 from the region 130 side, the stress due to Stick-Slip vibration is applied to the protruding portion 24 instead of the protruding portion 21. Thus, as shown in FIG. 13, the change in Stick-Slip vibration at the coverage ratio boundary (region R3) can be reduced as compared to the change shown in FIG. 11. Thereby, deformation of the protruding portion 21 can be reduced.

Furthermore, by adjusting the spacing between the line-and-space pattern and the dummy pattern, contact with the protruding portion 24 can be reduced even when the protruding portion 21 is deformed.

Figure 14:
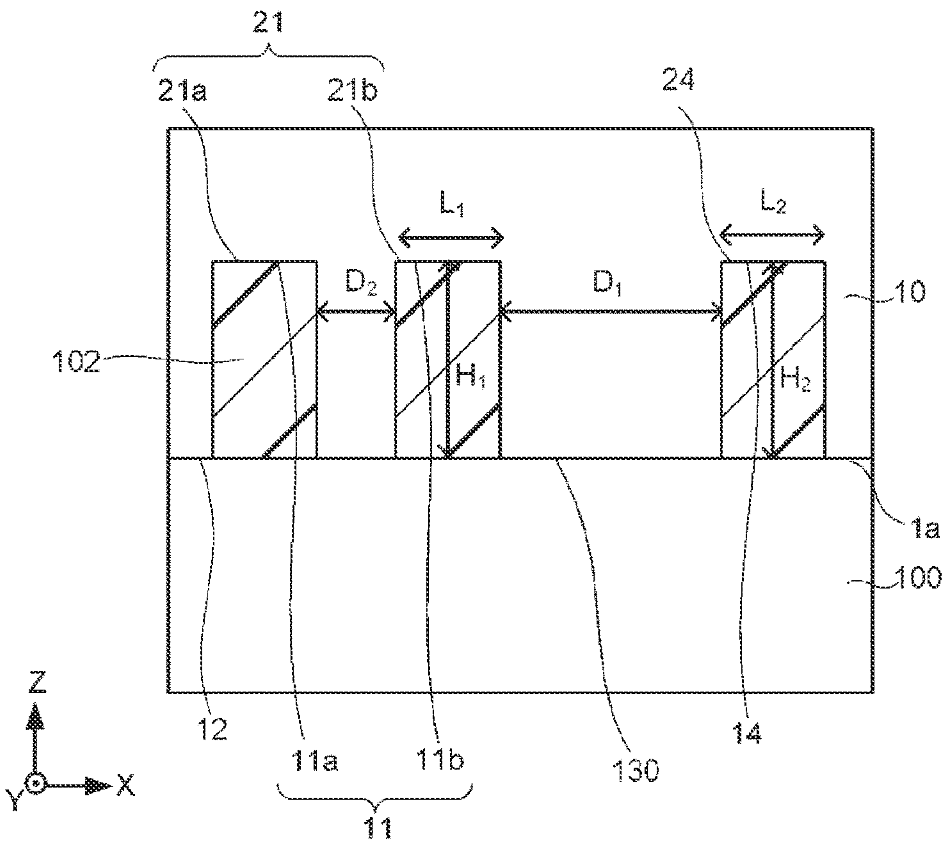
FIG. 14 is a schematic cross-sectional view showing a certain example of shapes of recessed portions in a template.

FIG. 14 is a schematic cross-sectional view showing an example of the shape of each of the recessed portions 11 and 14. For example, the template 10 preferably satisfies Equation 1 (relationship) below.

$$D_1>2(H_1+H_2)/\pi \qquad \text{Equation 1:}$$

Here, $D_1$ represents the length (shortest distance) between the recessed portion 11 (e.g., recessed portion 11*b*) and the recessed portion 14 that are closest to each other, $H_1$ represents the depth of the recessed portion 11 from the surface 1*a*, $H_2$ represents the depth of the recessed portion 14 from the surface 1*a*, and π represents the constant (pi). In FIG. 14, the depth $H_1$ and the depth $H_2$ have the same value. Furthermore, a length $D_2$ shown in FIG. 14 represents the length (shortest distance) between the recessed portions 11 that are closest to each other.

Figure 15:
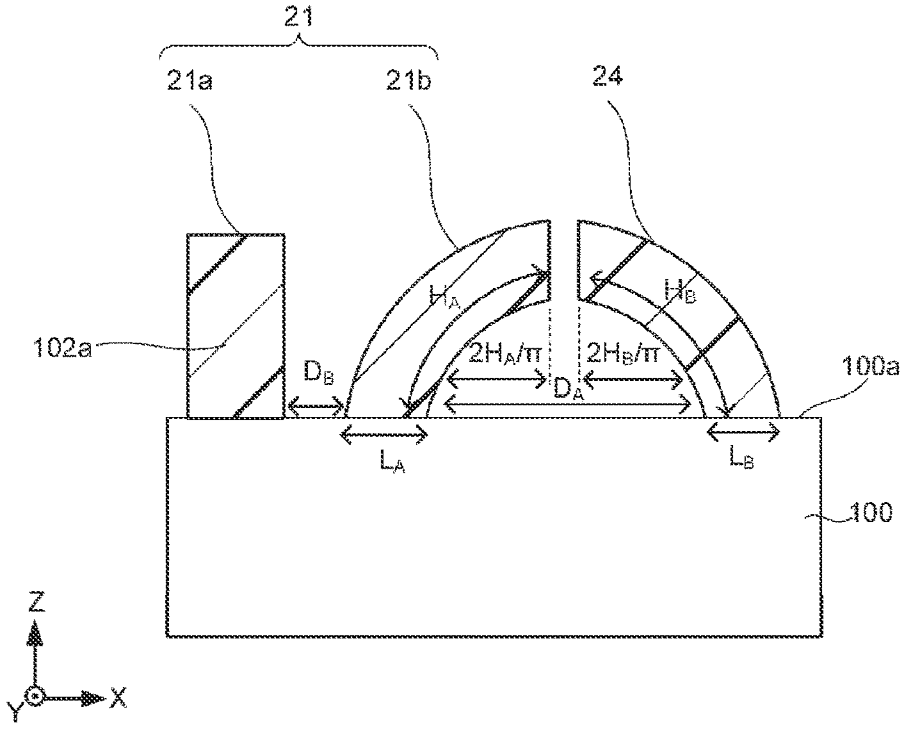
FIG. 15 is a schematic view showing an example of a pattern of a resist layer formed using a template that satisfies Equation: $D_1>2(H_1+H_2)/\pi$.

FIG. 15 is a schematic view showing an example of a pattern of a resist layer 102 formed using a template 10 that satisfies Equation 1: $D_1>2(H_1+H_2)/\pi$. FIG. 15 shows a cured layer 102*a* of the resist layer 102 having the protruding portion 21*a*, the protruding portion 21*b*, and the protruding portion 24. When the template 10 satisfies Equation 1: $D_1>2(H_1+H_2)/\pi$, the cured layer 102*a* of the resist layer 102 satisfies Equation 2 (relationship) below.

$$D_A>2(H_A+H_B)/\pi \qquad \text{Equation 2:}$$

Here, $D_A$ represents the length (shortest distance) between the protruding portion 21 (e.g., protruding portion 21*b*) and the protruding portion 24 that are closest to each other, $H_A$ represents the height of the protruding portion 21*b* from the surface 100*a* of the object 100, $H_B$ represents the height of the protruding portion 24 from the surface 100*a*, and *n* again represents the constant (pi). A length $D_B$ shown in FIG. 15 represents the length (shortest distance) between the closest protruding portions 21.

When Equation 2: $D_A>2(H_A\ H_B)/\pi$ is satisfied, as shown in FIG. 15, even when the protruding portions 21*b* and 24 are deformed, contact between the protruding portions 21*b* and 24 can be prevented. Since the protruding portion 21*b* and protruding portion 24 that are not in contact with each other typically return to their original shapes, a desired pattern can be formed by etching using the cured layer 102*a*.

Preferably, the length $D_1$ and the length $D_A$ are, for example, 5 nm or more, but no more than five times the length $D_2$ and the length $D_B$, respectively. When the length $D_1$ and the length D A exceed five times the respective lengths $D_2$ and $D_B$, it becomes difficult for the recessed portion 14 to reduce the change in the amplitude of the Stick-Slip vibration.

The aspect ratio (height to width) of each of the recessed portion 11, the recessed portion 14, the protruding portion 21, and the protruding portion 24 is preferably between 1.5 and 5, for example. When the aspect ratio is less than 1.5, the protruding portions 21 and 24 are less likely to fall down, so that the effect of reducing the amplitude of Stick-Slip vibration is small and perhaps of less concern. When the aspect ratio exceeds 5, the protruding portions 21 and 24 may not return to their original positions after falling down. The aspect ratio of the recessed portion 11 is defined by the depth $H_1$ to the width $L_1$ in the direction perpendicular to the length direction of the recessed portion 11 on the surface 1*a*. The aspect ratio of the recessed portion 14 is defined by the depth $H_2$ to the width $L_2$ in the direction perpendicular to the length direction of the recessed portion 14 on the surface 1*a*. The aspect ratio of the protruding portion 21 is defined by the height $H_A$ to the width $L_A$ in the direction perpendicular to the length direction of the protruding portion 21 on the surface 1*a*. The aspect ratio of the protruding portion 24 is defined by the height $H_B$ to the width $L_B$ in the direction perpendicular to the length direction of the protruding portion 24 on the surface 1*a*.

Other Shape Examples of Recessed Portion 11 and Recessed Portion 14

Figure 16:
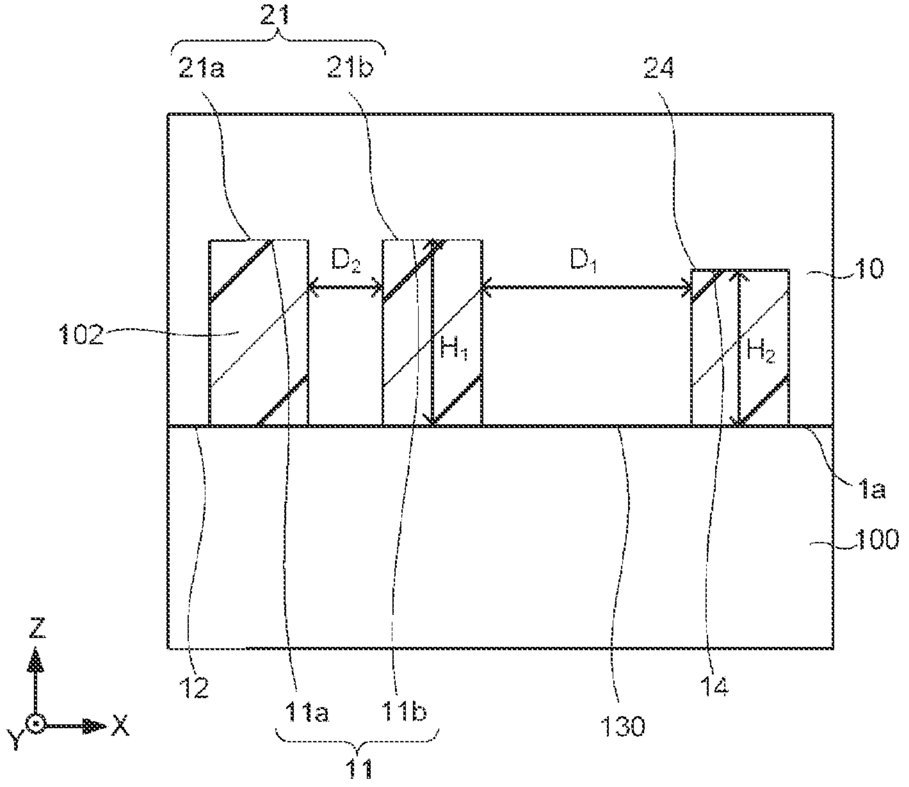
FIG. 16 is a schematic cross-sectional view showing a first modification of a shape of each of the recessed portions.

FIG. 16 is a schematic cross-sectional view showing a first modification of the shape of each of the recessed portions 11 and recessed portions 14. The recessed portions 11 and the recessed portion 14 shown in FIG. 16 differ from the recessed portions 11 and the recessed portion 14 shown in FIG. 14 in that the depth $H_2$ of the recessed portion 14 is less than the depth $H_1$ of the recessed portion 11. As described above, even when the depth $H_1$ and the depth $H_2$ are different values, if the template 10 satisfies Equation 1: $D_1>2(H_1+H_2)/\pi$, so that the resist layer 102 can satisfy Equation 2: $D_A>2\ (H_A+H_B)/\pi$, and contact between the protruding portions 21 and 24 can be prevented even if the protruding portions 21 and 24 are deformed. It should be noted that the height $H_1$ may be less than the height $H_2$. Further, the height $H_A$ may be less than the height $H_B$. Further, the height $H_B$ may be less than the height $H_A$.

Figure 17:
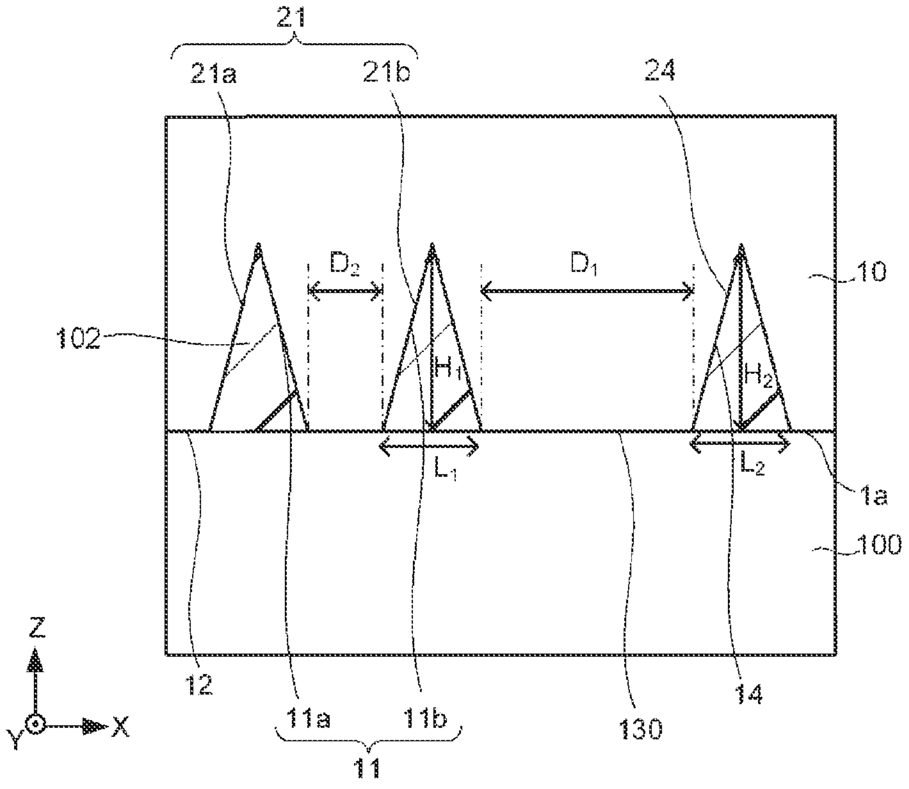
FIG. 17 is a schematic cross-sectional view showing a second modification of a shape of each of the recessed portions.

FIG. 17 is a schematic cross-sectional view showing a second modification of the shape of each of the recessed portions 11 and 14. The recessed portions 11 and 14 shown in FIG. 17 differ from the recessed portions 11 and 14 shown in FIG. 14 in that the cross-sectional shape of the recessed portions 14 and 11 in the XZ cross section is V-shaped. The depth $H_1$ is defined by the depth of the deepest portion of the recessed portion 11 from the surface 1*a*. The depth $H_2$ is defined by the depth of the deepest portion of the recessed portion 14 from the surface 1*a*. The width $L_1$ is defined by the width of the widest portion of the recessed portion 11 in the direction perpendicular to the length direction. The width $L_2$ is defined by the width of the widest portion of the recessed portion 14 in the direction perpendicular to the length direction. The height $H_A$, the height $H_B$, the width $L_A$, and the width $L_B$ are the same as the depth $H_1$, the depth $H_2$, the width $L_1$, and the width $L_2$, respectively. Even when the cross-sectional shape of the recessed portion 14 and the recessed portion 11 is a shape other than a rectangular shape, if the template 10 satisfies Equation 1: $D_1>2(H_1+H_2)/\pi$, so that the resist layer 102 and the cured layer 102*a* can satisfy Equation 2: $D_A>2(H_A+H_B)/\pi$, contact between the protruding portions 21 and 24 can be prevented even when the protruding portions 21 and 24 are deformed.

Other Layout Examples of Device Pattern

Figure 18:
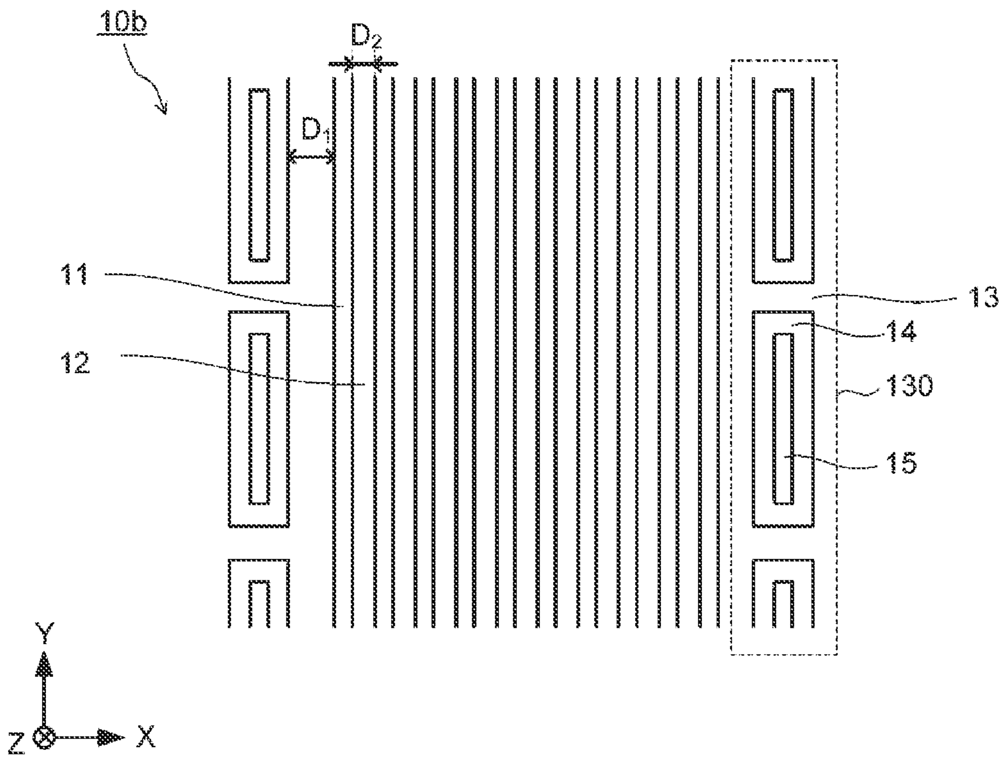
FIG. 18 is a schematic top view showing another example of a layout of a device pattern.
Figure 19:
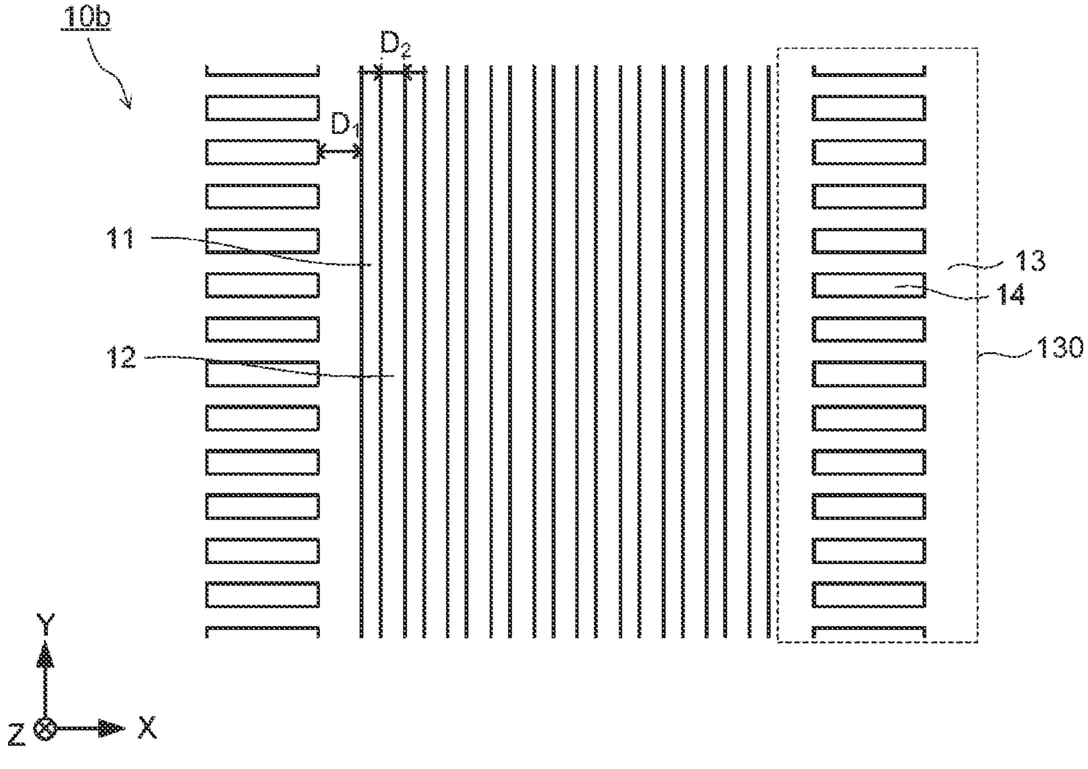
FIG. 19 is a schematic top view showing another example of a layout of a device pattern.
Figure 20:
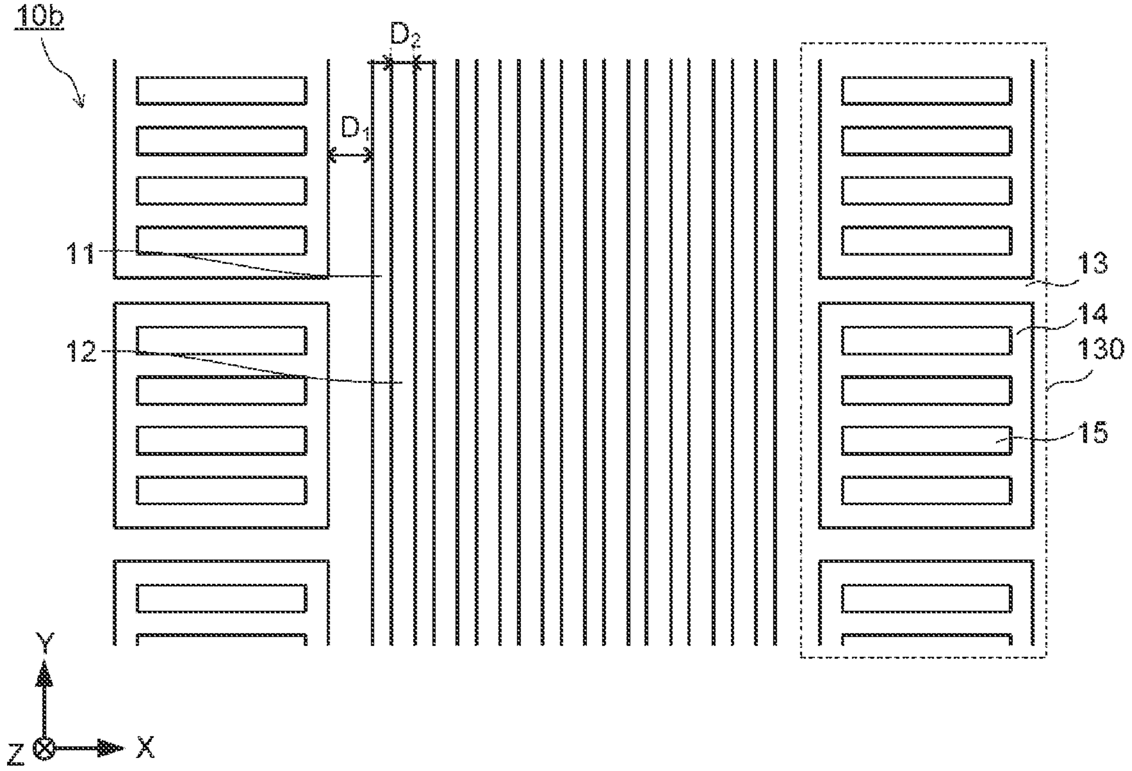
FIG. 20 is a schematic top view showing another example of a layout of a device pattern.

The layout of the device pattern 10*b* is not limited to the layout example shown in FIG. 8. FIGS. 18, 19, and 20 are schematic top views showing other examples of the layout of the device pattern 10*b*.

The device patterns 10*b* shown in FIGS. 18 to 20 have a dummy pattern including a plurality of recessed portions 14 and a plurality of protruding portions 15 in the regions 130 of the protruding portions 13 on both X-axis direction sides of a line-and-space pattern including a plurality of recessed portions 11 and a plurality of protruding portions 12.

The recessed portion 14 in FIG. 18 has an annular shape surrounding the protruding portion 15. The recessed portion 14 in FIG. 19 has a strip shape extending in the X-axis direction. The recessed portion 14 in FIG. 20 has a mesh shape surrounding each of the plurality of protruding portions 15. These recessed portions 14 and the protruding portions 15, are otherwise the same as previously described.

Thus, even when the layout shapes of the device pattern 10*b* are different, the template 10 can satisfy Equation 1: $D_1>2(H_1+H_2)/\pi$, so that the resist layer 102 and the cured layer 102*a* can satisfy Equation 2: $D_A>2(H_A+H_B)/\pi$, and contact between the protruding portions 21 and 24 can be prevented even when the protruding portions 21 and 24 are deformed when the template 10 is separated.

Second Embodiment

Figure 21:
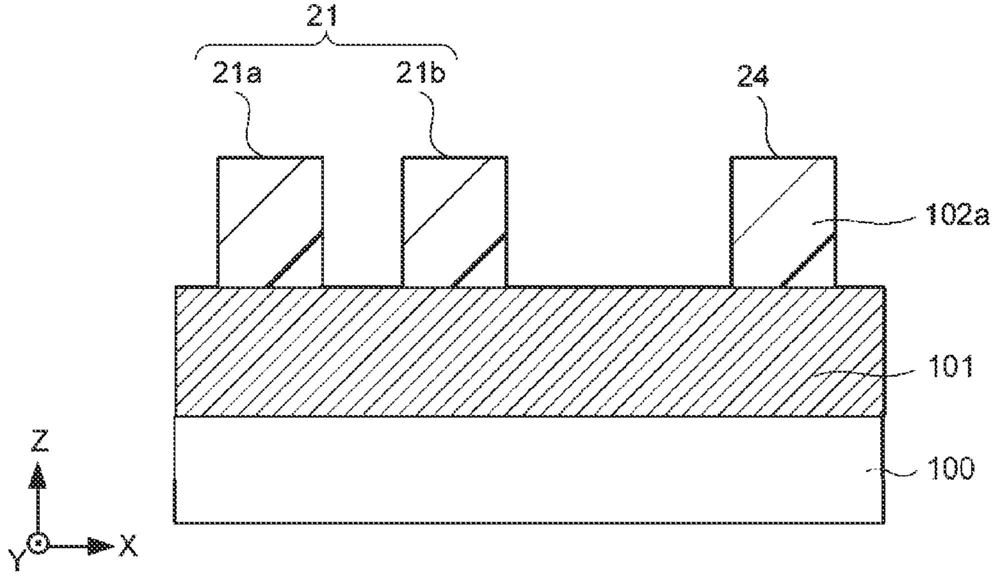
FIGS. 21 to 23 are schematic cross-sectional views illustrating aspects of a manufacturing method for a semiconductor device.
Figure 22:
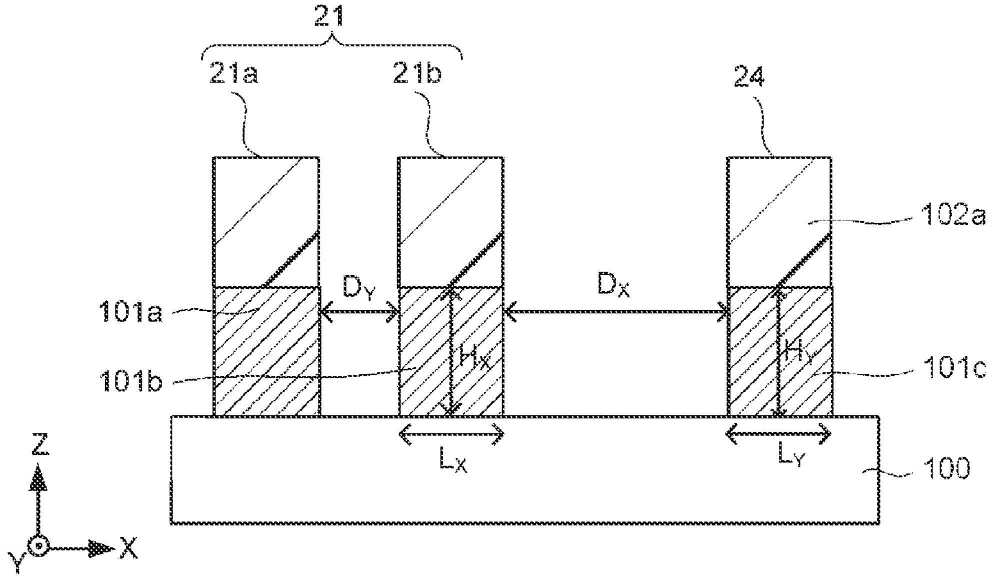
Figure 23:
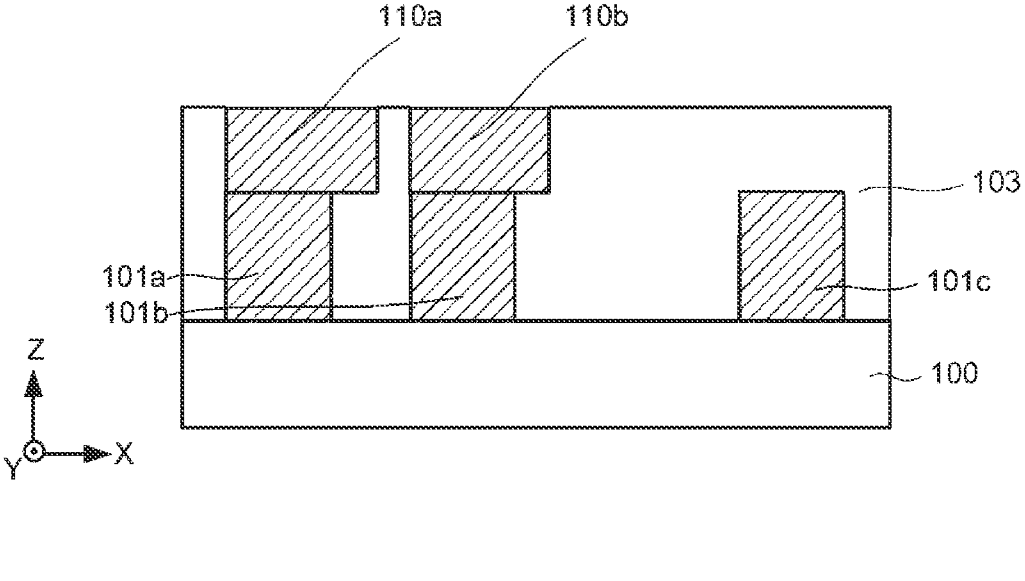

FIGS. 21, 22, and 23 are schematic cross-sectional views illustrating an example of a manufacturing method of a semiconductor device. First, as shown in FIG. 21, an under layer 101 is formed on an object 100, and a cured layer 102*a* formed from a resist layer 102 by imprint lithography is formed on the under layer 101 using the pattern forming method of the first embodiment. The layer 101 can be an insulating layer such as a silicon oxide film. Alternatively, the under layer 101 may be a conductive layer comprising a metal material such as copper. The upper surface of the under layer 101 is partially exposed.

Next, as shown in FIG. 22, the cured layer 102*a* of the resist layer 102 is used to process the under layer 101 to form an under layer pattern 101*a*, an under layer pattern 101*b*, and an under layer pattern 101*c*. The under layer pattern 101*a* is formed at a position overlapping the protruding portion 21*a*. The under layer pattern 101*b* is formed at a position overlapping the protruding portion 21*b*. The under layer pattern 101*c* is formed at a position overlapping the protruding portion 24. A wiring layer or the like can be formed by selectively removing portions of a conductive under layer 101 by dry etching using the cured layer 102*a* of the resist layer 102 as mask or the like. The shape of the processed object 100 is determined according to the shape of the device pattern 10*b*. When the under layer 101 is an insulating layer, a plurality of wiring patterns can be formed by embedding a metal layer (such as copper) between the formed under layer patterns. Alternatively, after a reversal material is embedded between the under layer patterns, a metal material can be formed at the positions of the under layer patterns. When the under layer 101 is a conductive layer containing a metal material, the formed under layer pattern becomes a conductor. An example in which the under layer 101 is a conductor material will be described below. In the following description, the under layer patterns 101*a*, 101*b* and 101*c* are called conductors 101*a*, 101*b* and 101*c*, respectively.

When the resist layer 102 and the cured layer 102*a* satisfy Equation 2: $D_A>2(H_A+H_B)/\pi$, the under layer 101 including the conductors 101*a*, 101*b* and 101*c* satisfies Equation 3 (relationship) below.

$$D_X>2(H_X+H_Y)/\pi \quad \text{Equation 3:}$$

Here, $D_X$ represents the length (shortest distance) between the conductors 101*b* and 101*c* that are closest to each other, $H_X$ represents the height of the conductor 101*b* from the surface of the object 100, $H_Y$ represents the height of the conductor 101*c* from the surface of the object 100, $\pi$ represents the constant (pi). A length $D_Y$ shown in FIG. 22 represents the length (shortest distance) between the conductors 101*a* and 101*b* that are closest to each other.

The length $D_X$ corresponds generally to the length $D_1$ and the length $D_A$. The length $D_X$ is, for example, 5 nm to no more than five times the length $D_Y$. Further, the aspect ratio of each of the conductor 101*a*, the conductor 101*b*, and the conductor 101*c* may be, for example, 1.5 to 5. The aspect ratio of the conductors 101*a* and 101*b* is defined by the height $H_X$ of the conductors 101*a* and 101*b* relative to the width $L_X$ in the direction perpendicular to the length direction on the surface of the object 100. The aspect ratio of the conductor 101*c* is defined by the height $H_Y$ of the conductor 101*c* to the width Ly in the direction perpendicular to the length direction.

As shown in FIG. 23, an insulating layer 103 is then formed on the formed conductors 101*a*, 101*b*, and 101*c*, and the insulating layer 103 is processed to form openings exposing the upper surfaces of the conductors 101*a* and 101*b*, and conductors 110*a* and 110*b* are formed in these respective openings. Alternatively, the conductor 110 may be processed directly. The conductor 110*a* and the conductor 110*b* comprise a metal material such as copper. The conductors 101*a* and 101*b* and the conductors 110*a* and 110*b* are part of the device pattern and may function as embedded wiring, for example, so that the conductors 101*a* and 101*b* and the conductors 110*a* and 110*b* are not covered with the insulating layer 103. On the other hand, the conductor 101*c* is part of the dummy pattern and does not form a circuit, so the conductor 101*c* can be covered with the insulating layer 103 and is left in an electrically floating state.

As described above, in the example of the manufacturing method of a semiconductor device of the present embodiment, a semiconductor device can be manufactured by processing a conductive layer on the object 100 using the cured layer 102*a* of the resist layer formed by the pattern forming method of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method, comprising:

placing an imprint material on an object;

pressing a first surface of a template against the imprint material on the object to mold the imprint material;

curing the molded imprint material on the object;

removing the template from cured imprint material, wherein the template has:

a first region on the first surface, a first recessed portion in the first region, a second region adjacent to first region on the first surface, and a second recessed portion in the second region, and the following relationship is satisfied for the template:

$$D_1>2(H_1+H_2)/\pi$$

where $D_1$ is a shortest distance between the first recessed portion and the second recessed portion, $H_1$ is a depth of the first recessed portion from the first surface, and $H_2$ is a depth of the second recessed portion from the first surface; and the cured imprint material has:

a second surface, a first protruding portion provided on the second surface, the first protruding portion corresponds to the first recessed portion, and a second protruding portion provided on the second surface, the second protruding portion corresponds to the first recessed portion, and the following relationship is satisfied for the cured imprint material:

$$D_A>2(H_A+H_B)/\pi$$

where $D_A$ is a shortest distance between the first protruding portion and the second protruding portion, $H_A$ is a height of the first protruding portion from the second surface and $H_B$ is a height of the second protruding portion from the second surface.

2. The pattern forming method according to claim 1, wherein an aspect ratio of the second protruding portion is at least 1.5.

3. The pattern forming method according to claim 1, wherein the first region has a plurality of first protruding portions forming a line-and-space pattern, and the second recessed portion is a dummy pattern.

4. The pattern forming method according to claim 3, wherein the value of $D_A$ is less than five times the value of $D_B$, where $D_B$ is a shortest distance between adjacent first protruding portions of the plurality of first protruding portions.

5. The pattern forming method according to claim 1, wherein the value of $H_B$ is less than the value of $H_A$.

6. The pattern forming method according to claim 1, wherein the value of $H_B$ is the same as the value of $H_A$.

7. The pattern forming method according to claim 1, wherein the object is a semiconductor wafer.

8. The pattern forming method according to claim 1, further comprising:

etching the object using the cured imprint resist as a mask after removing the template.

9. The pattern forming method according to claim 1, wherein the first recess portion extends lengthwise in a first direction along the first surface, and the second recess portion extends lengthwise in a second direction along the first surface, the second direction intersecting the first direction.

10. The pattern forming method according to claim 1, wherein the template is quartz.

* * * * *